(12) United States Patent
Zeng et al.

(10) Patent No.: US 9,129,698 B2
(45) Date of Patent: Sep. 8, 2015

(54) SOLID STATE STORAGE DEVICE AND SENSING VOLTAGE SETTING METHOD THEREOF

(71) Applicant: LITE-ON IT CORPORATION, Taipei (TW)

(72) Inventors: Shih-Jia Zeng, Hsinchu (TW); Jen-Chien Fu, Hsinchu (TW); Yu-Shan Wu, Hsinchu (TW); Hsie-Chia Chang, Hsinchu (TW)

(73) Assignee: Lite-On Technology Corporation, Taipei (TW)

( * ) Notice: Subject to any disclaimer, the term of this patent is extended or adjusted under 35 U.S.C. 154(b) by 99 days.

(21) Appl. No.: 14/160,566

(22) Filed: Jan. 22, 2014

(65) Prior Publication Data

US 2015/0124533 A1  May 7, 2015

(30) Foreign Application Priority Data

Nov. 5, 2013  (CN) .......................... 2013 1 0542369

(51) Int. Cl.
  *G11C 16/34*  (2006.01)
  *G11C 16/28*  (2006.01)
(52) U.S. Cl.
  CPC ................ *G11C 16/34* (2013.01); *G11C 16/28* (2013.01)

(58) Field of Classification Search
  CPC ........... G11C 16/0458; G11C 16/0483; G11C 16/34; G11C 16/28
  USPC ........................................ 365/185.22, 185.24
  See application file for complete search history.

(56) References Cited

U.S. PATENT DOCUMENTS

| 8,661,184 B2 * | 2/2014 | Wood et al. ................... 711/100 |
| 2008/0123420 A1 * | 5/2008 | Brandman et al. ........ 365/185.09 |

* cited by examiner

*Primary Examiner* — Tan T. Nguyen
(74) *Attorney, Agent, or Firm* — Jianq Chyun IP Office

(57) ABSTRACT

A solid state storage device and sensing voltage setting method thereof are provided, and the method includes following steps. A predetermined read voltage of the memory cells is adjusted to obtain a plurality of detection read voltages. The predetermined read voltage and the detection read voltages are respectively applied to a plurality of memory cells in order to read a plurality of verification bit data. A plurality of statistical parametric values between the predetermined read voltage and the detection read voltages adjacent to each other is calculated and recorded according to the verification bit data corresponding to the predetermined read voltage and the detection read voltages. An optimized read voltage is obtained according to the statistical parametric values.

18 Claims, 8 Drawing Sheets

SOLID STATE STORAGE DEVICE AND SENSING VOLTAGE SETTING METHOD THEREOF

CROSS-REFERENCE TO RELATED APPLICATION

This application claims the priority benefit of China application serial no. 201310542369.0, filed on Nov. 5, 2013. The entirety of the above-mentioned patent application is hereby incorporated by reference herein and made a part of this specification.

BACKGROUND OF THE INVENTION

1. Field of the Invention

The invention relates to a solid state storage device, and more particularly, to a sensing voltage setting method of a flash memory module.

2. Description of Related Art

The growth of digital cameras, mobile phones, and MP3 players has been rapid in recent years. Consequently, the consumers' demand for storage media has increased tremendously. Flash memory is one of the most adaptable storage media for portable electronic products such as laptop computer due to its data non-volatility, low power consumption, small volume, non-mechanical structure and high read/write speed. A solid state drive (SSD) is a storage apparatus which utilizes a flash memory as its storage medium. For these reasons, the flash memory has become an import part of the electronic industries.

FIG. 1 is a schematic diagram illustrating a flash memory device according to conventional art.

Referring to FIG. 1, a flash memory device 1 includes a charge trapping layer 2 for storing electrons, a control gate 3 for applying voltages, a tunnel oxide layer 4 and an interpoly dielectric layer 5. When it is intended to write data into the flash memory device 1, a threshold voltage of the flash memory device 1 may be changed by injecting electrons into the charge trapping layer 2. Accordingly, a digital-level state of the flash memory device 1 is defined to implement a function of storing data. Here, a process for injecting the electrons into the charge trapping layer 2 is referred to as a programming process. By contrast, when it is intended to erase the stored data, the injected electrons are removed from the charge trapping layer 2, and then the flash memory device 1 is restored back to a status before programming.

During writing and erasing operations, the flash memory device 1 deteriorates due to the frequent injection and removal of the electrons, thus increasing the speed of injecting the electrons and extending the distribution of the threshold voltage. As a result, after the frequent injection and removal of the electrons, the storage state of the flash memory device 1 is unlikely to be identified accurately, and results in occurrence of error bits.

SUMMARY OF THE INVENTION

Accordingly, the invention is directed to a solid state storage device and a sensing voltage setting method thereof, and capable of accurately identify a storage state of the memory cell when the memory cell deteriorates.

The invention provides a sensing voltage setting method of a solid state storage device, and the solid state storage device includes a flash memory module configured to store data. The flash memory module has a plurality of memory cells, and each of the memory cells has a first storage state and a second storage state. The sensing voltage setting method includes the following steps. First, a predetermined read voltage of the memory cells is adjusted to obtain a plurality of detection read voltages. Next, the predetermined read voltage and the detection read voltages are respectively applied to a plurality of memory cells in order to read a plurality of verification bit data. Thereafter, a plurality of statistical parametric values between the predetermined read voltage and the detection read voltages adjacent to each other is calculated and recorded according to the verification bit data corresponding to the predetermined read voltage and the detection read voltages. An optimized read voltage is obtained according to the statistical parametric values.

In an exemplary embodiment of the invention, the step of adjusting the predetermined read voltage of the memory cells to obtain the detection read voltages includes: using the predetermined read voltage as a reference for obtaining the detection read voltages according to the predetermined read voltage and a plurality of predetermined intervals, in which a number of the detection read voltages is equal to a number of the predetermined intervals.

In an exemplary embodiment of the invention, the step of calculating and recording the statistical parametric values between the predetermined read voltage and the detection read voltages adjacent to each other according to the verification bit data corresponding to the predetermined read voltage and the detection read voltages includes: calculating a plurality of variations of bit data identified as in the first storage state among the verification bit data corresponding to the predetermined read voltage and the detection read voltages; calculating and obtaining the statistical parametric values between the predetermined read voltage and the detection read voltages adjacent to each other according to the variations and the predetermined intervals respectively corresponding to the predetermined read voltage and the detection read voltages.

In an exemplary embodiment of the invention, before the step of obtaining the optimized read voltage according to the statistical parametric values, the method further includes: applying an additional detection read voltage to the memory cells, and calculating an additional statistical parametric value between one of the detection read voltages adjacent to the additional detection read voltage and the additional detection read voltage; and recording the additional statistical parametric value as one of the statistical parametric values.

In an exemplary embodiment of the invention, the step of obtaining the optimized read voltage according to the statistical parametric values includes: establishing a polynomial equation according to the statistical parametric values currently recorded and approximating the statistical parametric values through the polynomial equation; and searching a minimum estimated value according to the polynomial equation and obtaining the optimized read voltage according to the minimum estimated value.

In an exemplary embodiment of the invention, before the step of establishing the polynomial equation according to the statistical parametric values currently recorded and approximating the statistical parametric values through the polynomial equation, the method further includes: determining whether a local minimum can be searched from the statistical parametric values; and if the local minimum cannot be searched from the statistical parametric values, applying an additional detection read voltage to the memory cells to obtain the additional statistical parametric value and record the additional statistical parametric value as one of the statistical parametric values.

In an exemplary embodiment of the invention, before the step of applying the additional detection read voltage to the memory cells to obtain the additional statistical parametric value and record the additional statistical parametric value as one of the statistical parametric values, the method further includes: determining whether a read number is greater than a predetermined number, in which the read number is a sum of a number of times for applying the detection read voltages and applying the predetermined read voltage to the memory cells and a number of times for applying the additional detection read voltage to the memory cells; and if the read number is greater than the predetermined number, obtaining the optimized read voltage according to the statistical parametric values currently recorded.

In an exemplary embodiment of the invention, after the step of establishing the polynomial equation according to the statistical parametric values currently recorded and approximating the statistical parametric values through the polynomial equation, the method further includes: determining whether the polynomial equation and the statistical parametric values are in a normal status according to the polynomial equation and the statistical parametric values; and if the polynomial equation and the statistical parametric values are not in the normal status, applying the additional detection read voltage to the memory cells to obtain the additional statistical parametric value and record the additional statistical parametric value as one of the statistical parametric values.

In an exemplary embodiment of the invention, the sensing voltage setting method further includes: determining whether the statistical parametric values are in a first shifting status or in a second shifting status according to a parametric model; when the statistical parametric values are in the first shifting status, selecting the additional detection read voltage greater than the predetermined read voltage; and when the statistical parametric values are in the second shifting status, selecting the additional detection read voltage less than the predetermined read voltage.

From another perspective, the invention provides a solid state storage device, which includes a flash memory module and a memory controller. The flash memory module has a plurality of memory cells, and each of the memory cells has a first storage state and a second storage state. The memory controller is coupled to the flash memory module, and the memory controller is configured to adjust a predetermined read voltage of the memory cells to obtain a plurality of detection read voltages. The memory controller is further configured to apply the predetermined read voltage and the detection read voltages respectively to the memory cells to read a plurality of verification bit data corresponding to the predetermined read voltage and the detection read voltages. The memory controller is further configured to calculate and record a plurality of statistical parametric values between the predetermined read voltage and the detection read voltages adjacent to each other according to the verification bit data corresponding to the predetermined read voltage and the detection read voltages. The memory controller is further configured to obtain an optimized read voltage according to the statistical parametric values.

Based on above, the solid state storage device and the sensing voltage setting method thereof according to embodiments of the invention are capable of adjusting the predetermined read voltage by using the appropriate detection read voltages based on the threshold voltage distribution of the memory cells. As a result, the storage state of the memory cell may be correctly identified, so as to avoid loss of data stored in the memory cell.

To make the above features and advantages of the disclosure more comprehensible, several embodiments accompanied with drawings are described in detail as follows.

DESCRIPTION OF THE EMBODIMENTS

Generally, a solid state storage device includes a flash memory module and a memory controller. The solid state storage device is usually used together with a host system so that the host system may write data to or read data from the solid state storage device.

Figure 1:
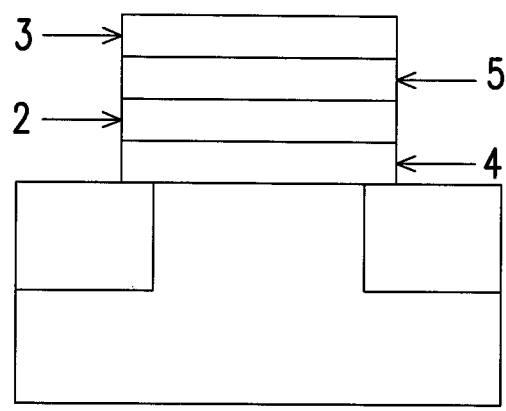
FIG. 1 is a schematic diagram illustrating a flash memory device according to conventional art.
Figure 2:
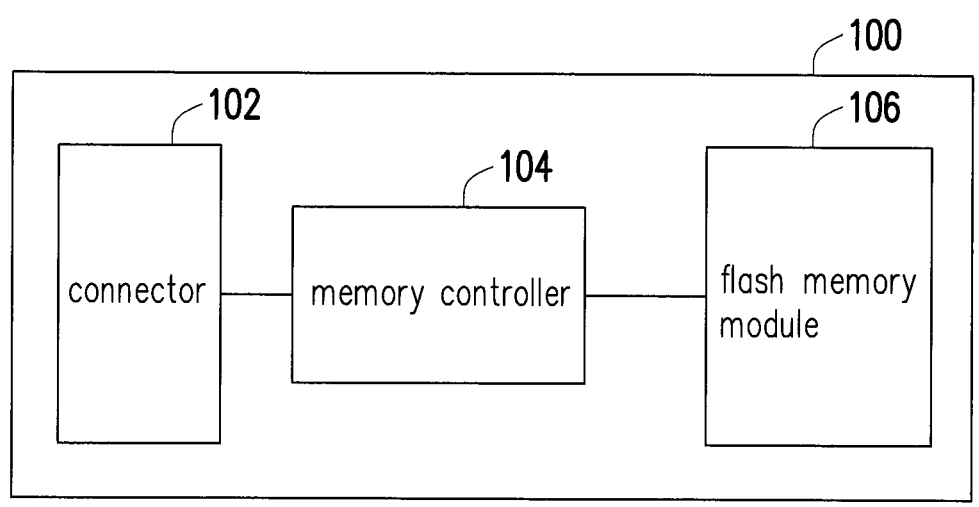
FIG. 2 is a schematic block diagram illustrating a memory storage device according to an exemplary embodiment.

FIG. 2 is a schematic block diagram illustrating a solid state storage device according to an exemplary embodiment. Referring to FIG. 2, a solid state storage device 100 includes a connector 102, a memory controller 104, and a flash memory module 106.

In the present exemplary embodiment, the connector 102 is compatible with a Universal Serial Bus (USB) interface. However, the invention is not limited thereto, and the connector 102 may also be compatible with a Parallel Advanced Technology Attachment (PATA) standard, an Institute of Electrical and Electronic Engineers (IEEE) 1394 standard, a Peripheral Component Interconnect Express (PCI Express) interface standard, a Secure Digital (SD) interface standard, a Serial Advanced Technology Attachment (SATA) standard, a Memory Stick (MS) interface standard, a Multi Media Card (MMC) interface standard, an embedded MMC (eMMC) interface standard, a Universal Flash Storage (UFS) interface standard, a Compact Flash (CF) interface standard, an Integrated Device Electronics (IDE) interface standard or other suitable standards.

The memory controller 104 is used to execute a plurality of logic gates or control commands which are implemented in a hardware form or in a firmware form, so as to perform operations of writing, reading or erasing data in the flash memory module 106 according to the commands of the host system.

The flash memory module 106 is coupled to the memory controller 104 and configured to store the data written by the host system. The flash memory module 106 may be a Single Level Cell (SLC) NAND flash memory module (i.e., a flash memory module capable of storing one bit data in one memory cell), a Multi Level Cell (MLC) NAND flash memory module (i.e., a flash memory module capable of storing two bit data in one memory cell), a Trinary Level Cell (TLC) NAND flash memory module (i.e., a flash memory module capable of storing three bit data in one memory cell), other flash memory modules or any memory module having the same features.

Figure 3:
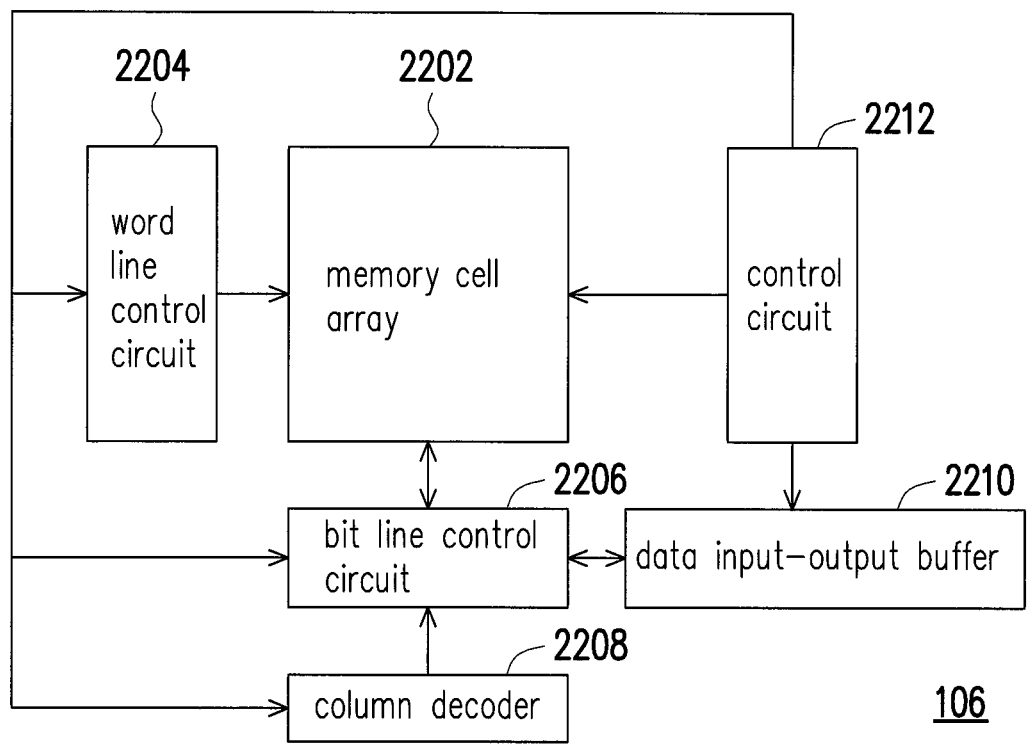
FIG. 3 is a schematic block diagram illustrating a flash memory module according to an exemplary embodiment.

FIG. 3 is a schematic block diagram illustrating a flash memory module according to an exemplary embodiment. Referring to FIG. 3, the flash memory module 106 includes a memory cell array 2202, a word line control circuit 2204, a bit line control circuit 2206, a column decoder 2208, a data input-output buffer 2210 and a control circuit 2212.

Figure 4:
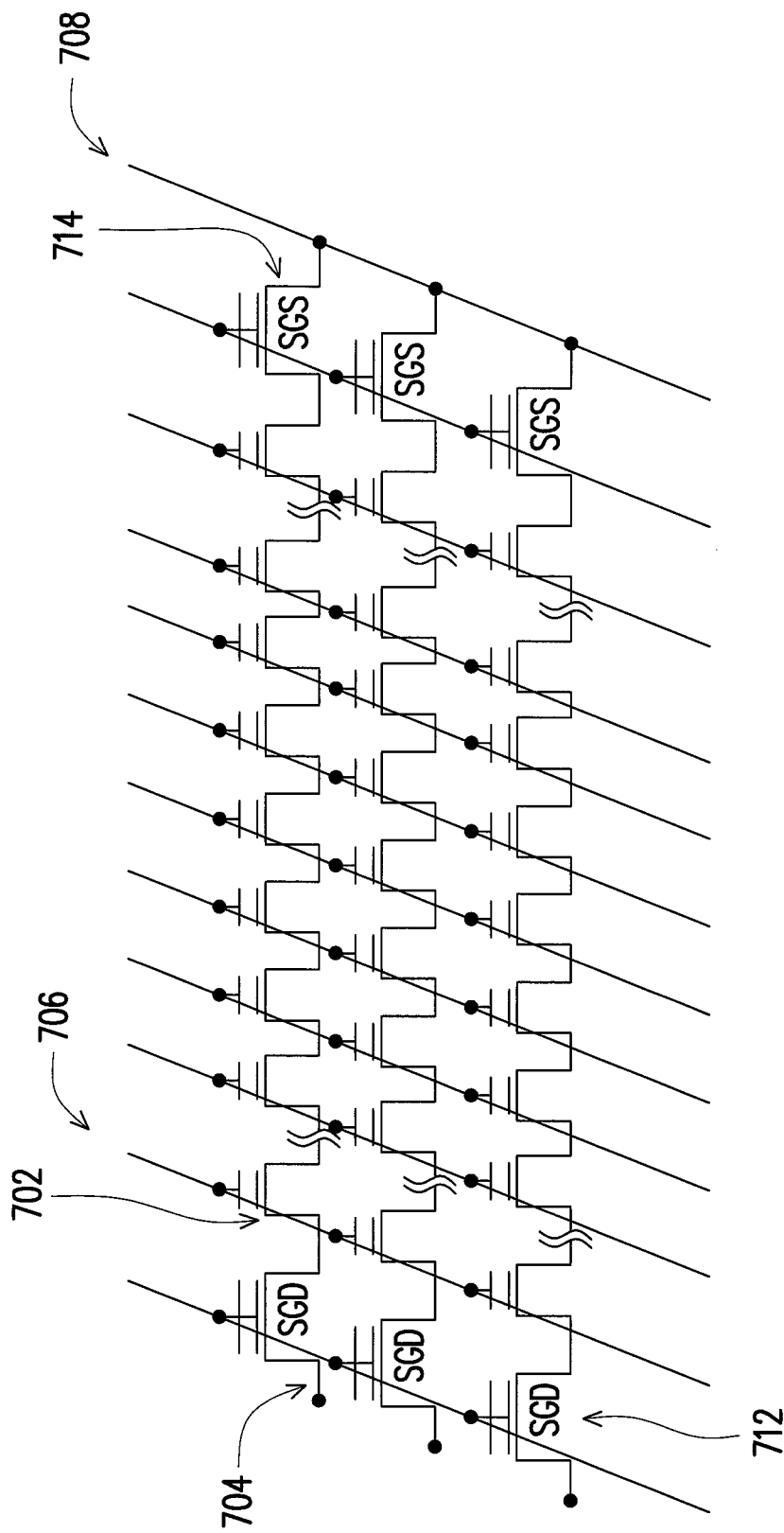
FIG. 4 is a schematic diagram illustrating a memory cell array according to an exemplary embodiment.

FIG. 4 is a schematic diagram illustrating a memory cell array according to an exemplary embodiment. The memory cell array 2202 includes a plurality of memory cells 702 used to store data, a plurality of select gate drain (SGD) transistors 712, a plurality of select gate source (SGS) transistors 714, as well as a plurality of bit lines 704, a plurality of word lines 706, a common source line 708 connected to the memory cells. The memory cells 702 are disposed at intersections of the bit lines 704 and the word lines 706 in arrays. In case a write command is received or data are read from the memory controller 104, the control circuit 2212 controls the word line control circuit 2204, the bit line control circuit 2206, the column decoder 2208, the data input-output buffer 2210 to write the data in the memory cell array 2202 or read the data from the memory cell array 2202. Therein, the word line control circuit 2204 is configured to control voltages applied to the word lines 706; the bit line control circuit 2206 is configured to control voltages applied to the bit lines 704; the column decoder 2208 is configured to select the corresponding bit line according to a decoding row address in a command; and the data input-output buffer 2210 is configured to temporarily store the data.

The bit data stored in the memory cells in the flash memory module 106 are represented by a gate threshold voltage. More specifically, each of the memory cells in the memory array 2022 has a plurality of storage states, and the storage states are differentiated according a plurality of predetermined read voltages when reading the data.

Figure 5:
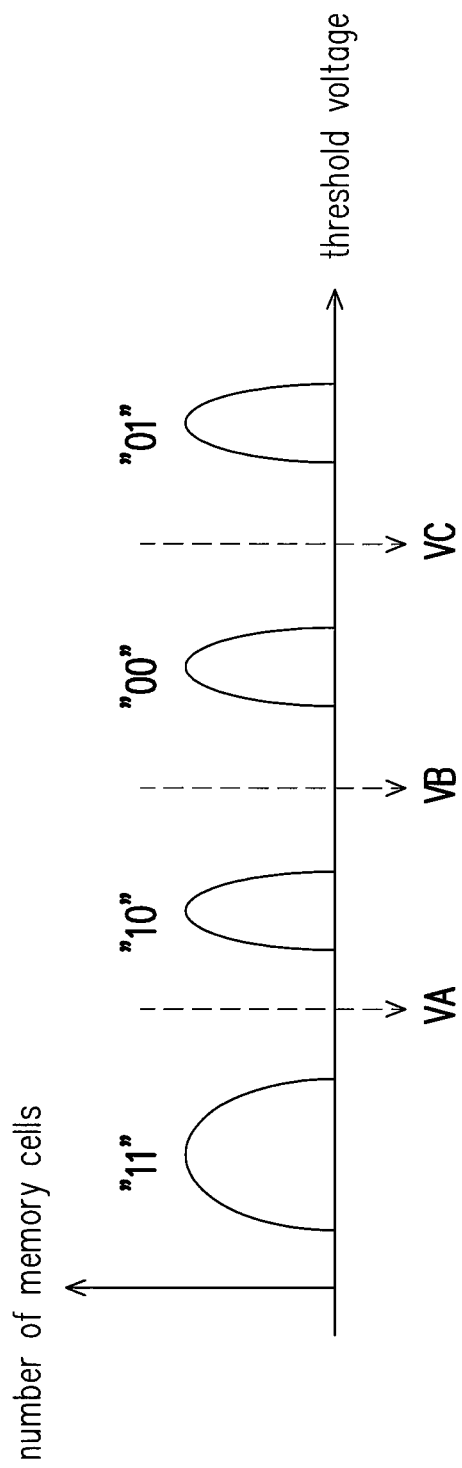
FIG. 5 is a schematic diagram illustrating a relation between the storage states and the threshold voltages in the flash memory module according to an exemplary embodiment.

More specifically, FIG. 5 is a schematic diagram illustrating a relation between the storage states and the read voltages in the flash memory module according to an exemplary embodiment. Referring to FIG. 5 that uses the MLC NAND flash memory for example, in which the threshold voltage of each of the memory cells may be differentiated into four storage states according to a first predetermined read voltage VA, a second predetermined read voltage VB and a third predetermined read voltage VA, and bit data "11", "10", "00" and "01" are represented by the storage states, respectively. In other words, each of the storage states includes a least significant bit (LSB) and a most significant bit (MSB). In this exemplary embodiment, each of the memory cells may store two bit data. Therefore, each of the memory cells includes four storage states, and the four storage states are the threshold voltages being differentiated by using the three predetermined read voltages. It should be understood that, the storage states corresponding to the threshold voltages as illustrated in the FIG. 5 are merely an example and are not intended to limit the scope of the invention. In another exemplary embodiment of the invention, the storage states corresponding to the read voltages may also have an arrangement of "11", "10", "01" and "00" that is arranged according to the threshold voltages from small to large.

Figure 6A:
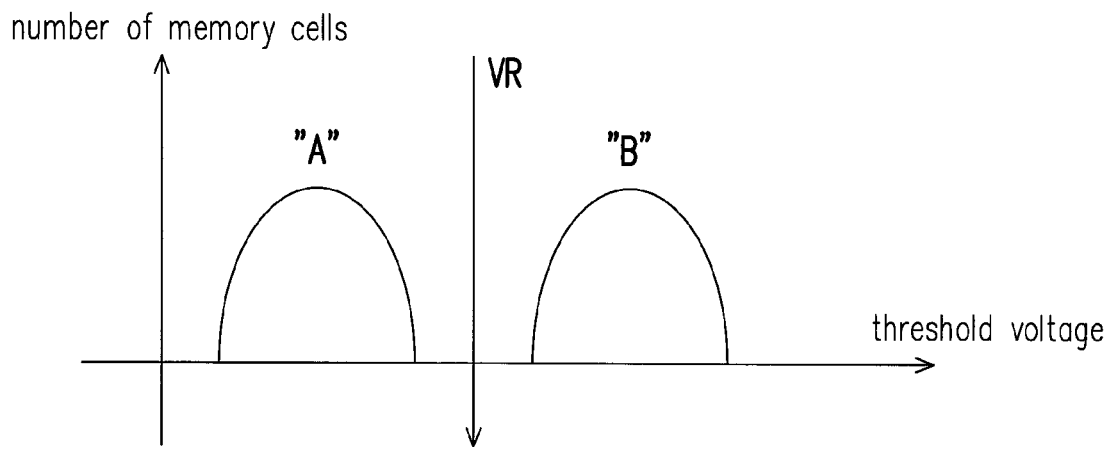
FIG. 6A to FIG. 6C are other schematic diagrams illustrating a relation between the storage states and the threshold voltages in the flash memory module according to an exemplary embodiment.
Figure 6B:
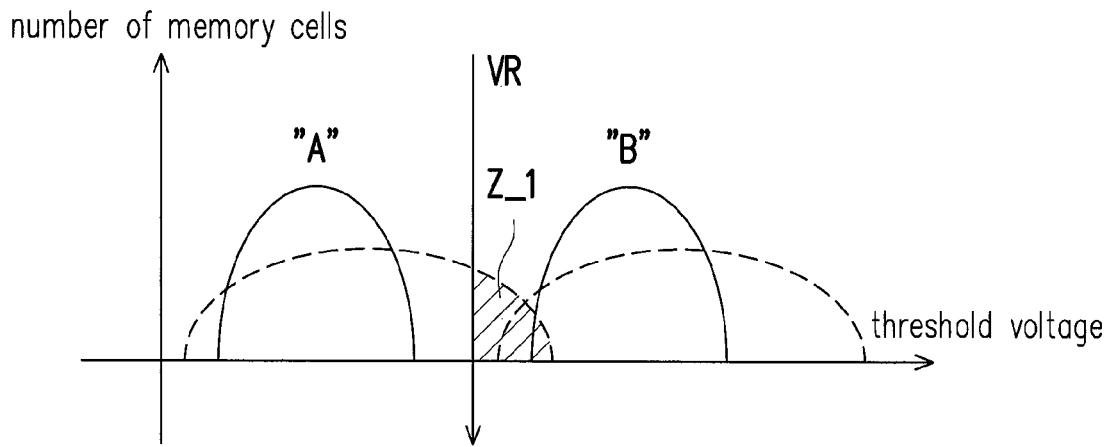
Figure 6C:
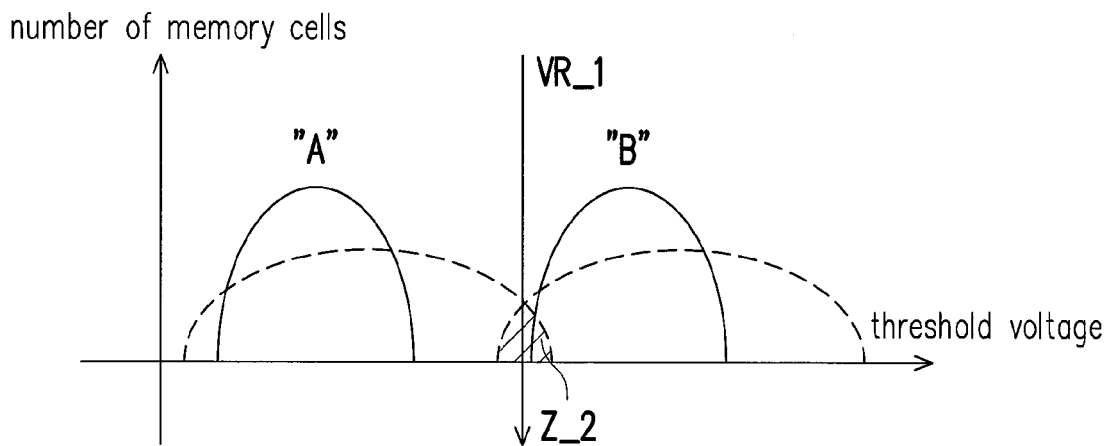

For describing the invention more clearly, FIG. 6A to FIG. 6C are schematic diagrams illustrating a relation between the storage states and the read voltages in the flash memory module according to an exemplary embodiment. Referring to FIG. 6A, in view of above description, it can be known that the bit data stored in the memory cells are represented by the threshold voltages. When it is intended to read the data from the memory cells, the memory controller 104 issues a read command to the flash memory module 106. Accordingly, a control circuit 2212 of the flash memory module 106 applies the predetermined read voltage to the word line connected to the memory cells to be read, so as to verify the storage states of the memory cells. As shown in FIG. 6A, a predetermined read voltage VR may be used to identify whether the bit data stored in the memory cells are in the storage state "A" or the storage state "B". In brief, when the control circuit 2212 applies the predetermined read voltage VR to the memory cells intended to be read, the memory cells being turned on are identified as in the storage state "A", and the memory cells not being turned on are identified as in the storage state "B", such that the bit data stored in the memory cells may then be informed of Nonetheless, during the writing and erasing processes, a part of structures in the memory cells 702 of the flash memory module 106 may be deteriorated (e.g., the tunnel oxide layer may be deteriorated) due to the frequent injection and removal of the electrons. For instance, the threshold voltages of the memory cells 702 may shift as the electrons are injected and removed repeatedly (as illustrated in dash lines of FIG. 6B), and result in that the storage states of the memory cells are unlikely to be identified accurately by the predetermined read voltage VR. As shown in FIG. 6B, a slash area Z_1 represents the occurrence of inaccurate determination when using the predetermined read voltage VR. In brief, the memory cells in the slash area Z_1 are supposed to be identified as in the storage state "A", but the threshold voltages have already been shifted by the frequent injection and removal of the electrons, such that the memory cells are determined as in the storage state "B" based on the predetermined read voltage VR.

Accordingly, based on a characteristic that the threshold voltage distribution of the memory cells may be shifted, the invention may adaptively adjust the read voltage for identifying the storage states to further improve accuracy in accessing data in the solid state storage device. In particular, because the threshold voltage distribution of the memory cells 702 of the flash memory module 106 have already been shifted, the memory controller 104 may estimate an ideal read voltage VR_1 (as shown in FIG. 6C) suitable for the threshold voltage distribution being shifted in the present embodiment. In brief, when the ideal read voltage VR_1 is used to identify the memory cells as in the storage state "A" or in the storage state "B", in comparison to the slash region Z_1 depicted in FIG. 6B where the data identification may be identified inaccurately, a slash region Z_2 depicted in FIG. 6C where the data may be identified inaccurately is relatively smaller. In other words, a probability for identifying the data inaccurately may be lowered by using the ideal read voltage VR_1 for reading the data.

Figure 7:
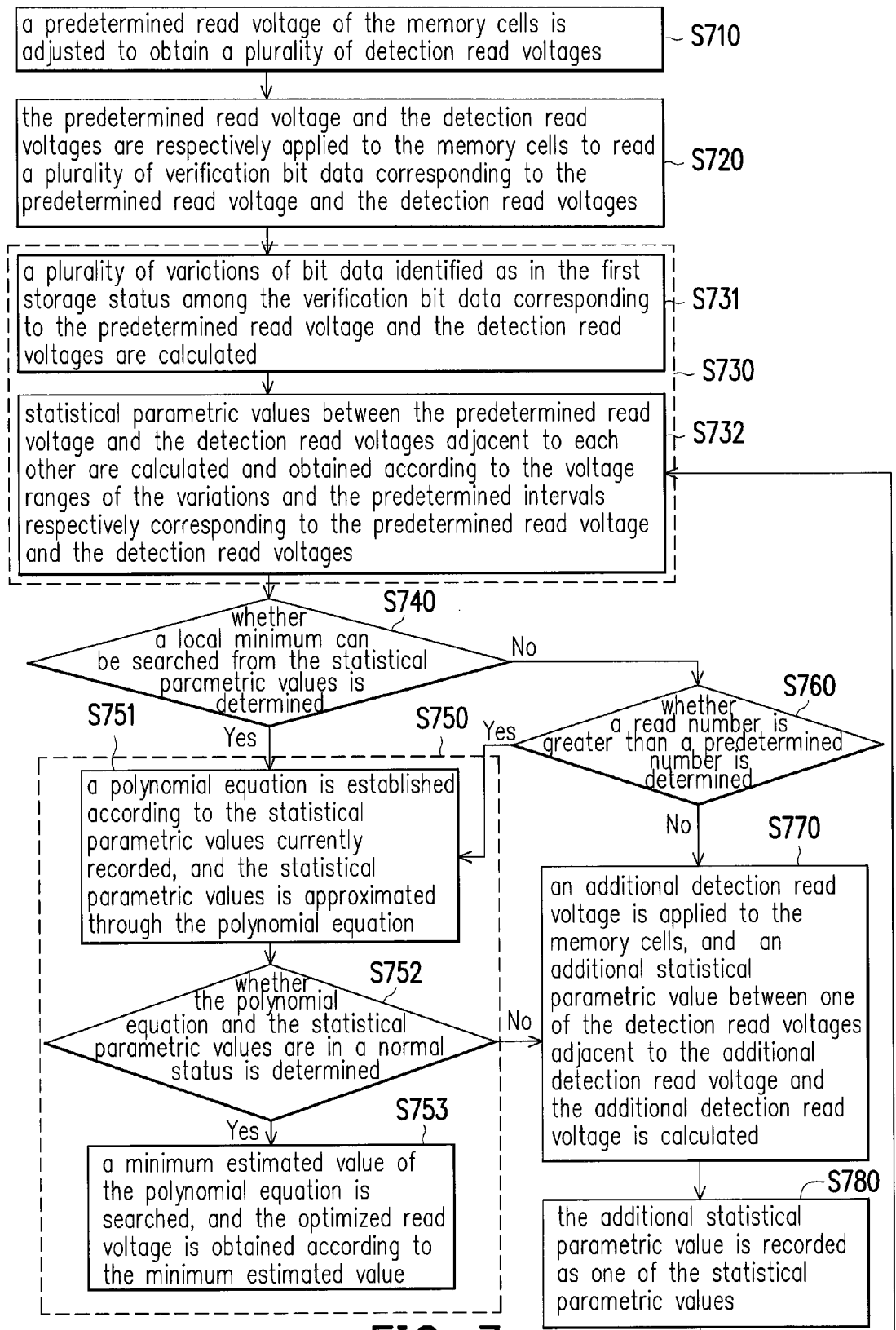
FIG. 7 is a flowchart illustrating a sensing voltage setting method according to an embodiment of the invention.

FIG. 7 is a flowchart illustrating a sensing voltage setting method of a solid state storage device according to an embodiment of the invention. Referring to FIG. 2, FIG. 3 and FIG. 7, a method of the present embodiment is adapted to the solid state storage device 100 as described above. Detailed steps in the method of the present embodiment are described as below, with reference to each elements of the solid state storage device 100 depicted in FIG. 2. More specifically, the memory controller 104 may set a plurality of detection read voltages according to the predetermined read voltage for reading the data from the memory cells, and decide an optimized read voltage according to a statistical data of verification bit data among the data being read.

In the present embodiment, the memory controller 104 may program the data into the memory cells of the flash memory module 106 in advance, so as to further decide the optimized read voltage currently under estimation is going to be used on which two storage states of the read voltages. Therein, the predetermined read voltage may identify the memory cells stored with the data as in a first storage state or in a second storage state when reading the data. First, in step S710, the memory controller 104 adjusts a predetermined read voltage of the memory cells to obtain a plurality of detection read voltages. Generally, the predetermined read voltage is already decided when the flash memory module 106 is designed by a design personnel. In the present embodiment, the predetermined read voltage is the read voltage initially used by the memory controller 104 for reading the data.

Figure 8:
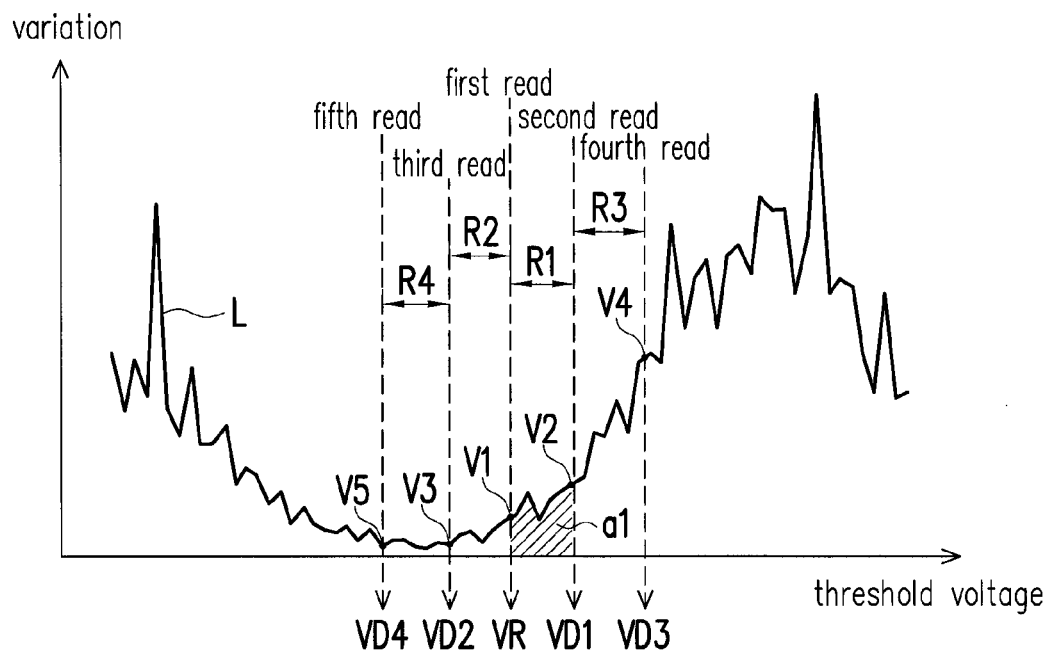
FIG. 8 is a schematic diagram illustrating a relation between the variations and the threshold voltages according to an embodiment of the invention.

More specifically, FIG. 8 is a schematic diagram illustrating a relation between the variations and the threshold voltages according to an embodiment of the invention. Referring to FIG. 8, the memory controller 104 may use the predetermined read voltage VR as a reference for obtaining the detection read voltages according to the predetermined read voltage VR and a plurality of predetermined intervals. More specifically, in the embodiment depicted in FIG. 8, the memory controller 104 uses the predetermined read voltage VR as a center reference point for obtaining the detection read voltages by using a summation and a decrement methods. In other words, a predetermined interval R1 is a voltage difference between a detection voltage VD1 and the predetermined read voltage VR, and a predetermined interval R2 is a voltage difference between a detection voltage VD2 and the predetermined read voltage VR. Furthermore, a predetermined interval R3 is a voltage difference between a detection voltage VD3 and the detection voltage VD1, and a predetermined interval R4 is a voltage difference between a detection voltage VD4 and the detection voltage VD2. For instance, in case the predetermined read voltage VR being 10V, the predetermined interval R1 being 0.3V and the predetermined interval R3 being 0.3V are provided, the detection voltage VD1 is 10.3V and the detection voltage VD3 is 10.6V.

It should be noted that in the present embodiment, the predetermined intervals R1 to R4 are not limited to fall within same voltage range, and the predetermined intervals R1 to R4 may each have a voltage range designed based on actual applications. In addition, a number of the predetermined intervals may also be designed based on actual applications, and the invention is not limited thereto. Nevertheless, for convenience of illustration, the predetermined intervals R1 to R4 are set to fall within the same voltage range (R1=R2=R3=R4=0.3V) for example, but the invention is not limited thereto. Accordingly, the memory controller 104 may obtain the detection read voltages VD1 to VD4 based on the predetermined read voltage VR and the predetermined intervals R1 to R4.

Thereafter, in step S720, the memory controller 104 applies the predetermined read voltage VR and the detection read voltages VD1 to VD4 respectively to the memory cells to read a plurality of verification bit data corresponding to the predetermined read voltage VR and the detection read voltages VD1 to VD4. In brief, based on influence of shifting in the threshold voltage distribution of the memory cells, each of the verification bit data obtained after reading by the memory controller 104 using the predetermined read voltage VR and the detection read voltages VD1 to VD4 are different from one another.

In step S730, the memory controller 104 calculates and records a plurality of statistical parametric values between the predetermined read voltage and the detection read voltages adjacent to each other according to the verification bit data corresponding to the predetermined read voltage VR and the detection read voltages VD1 to VD4. In brief, the memory controller 104 obtains a plurality of different verification bit data by using different voltages, and obtains the statistical parametric values between the predetermined read voltage and the detection read voltages adjacent to each other according to information provided by the verification bit data. In the present embodiment, step S730 includes steps S731 and S732. In step S731, the memory controller 104 calculates a plurality of variations V1 to V5 of bit data identified as in the first storage state among the verification bit data corresponding to the predetermined read voltage VR and the detection read voltages VD1 to VD4. Therein, the variations may represent a degree and a condition of shifting in the threshold voltage distribution, and a unit used therein is a number of the memory cells.

More specifically, during production of the solid state storage device 100, the memory control 104 may program detection data into the memory cells and apply the predetermined read voltage VR and the detection read voltages VD1 to VD4 memory to read a plurality of initial verification bit data and calculate a number of the bit data identified as in the first storage state among the initial verification bit data. Information regarding the number of the bit data identified as in the first storage state among the initial verification bit data corresponding to the predetermined read voltage VR and the detection read voltages VD1 to VD4 are recorded.

Accordingly, in the present embodiment, the memory controller 104 may calculate the number of the bit data currently identified as in the first storage state among the verification bit data corresponding to the predetermined read voltage VR and the detection read voltages VD1 to VD4. Next, the memory controller 104 may subtract the number of the bit data identified as in the first storage state among the verification bit data obtained by using the predetermined read voltage VR and the detection read voltages VD1 to VD4 by the number of the bit data identified as in the first storage state among the corresponding initial verification bit data. As a result, the variations of the bit data identified as in the first storage state may be obtained. Based on the above, it can be known that in case the different read voltages are applied, the different verification bit data may be read. Besides, since the threshold voltage distribution may shift with increase in usage time, different read results may also be obtained by using the same read voltage for reading the data but at different times. It should be noted that, obtaining the variations by using the initial verification bit data is just an exemplary embodiment of the present invention and a scope of the present invention is not limited thereto. The memory controller 104 may also obtain variations having the same physical meanings by using other methods.

Based on above, the memory controller 104 may obtain the variations of the predetermined read voltage VR and the detection read voltages VD1 to VD4 according to the initial verification bit data and the verification bit data of each of the predetermined read voltage VR and the detection read voltages VD1 to VD4. In order to describe the invention more clearly, a curve L depicted FIG. 8 represents the variations corresponding to the different read voltages. However, in steps for implementing the invention, the memory controller 104 may not calculate the variations corresponding to all of the read voltages one by one but only obtain the variations V1 to V5 corresponding to the predetermined read voltage VR and the detection read voltages VD1 to VD4. As shown in FIG. 8, the predetermined read voltage VR is corresponding to the variation V1; the detection read voltage VD1 is corresponding to the variation V2; the detection read voltage VD2 is corresponding to the variation V3; the detection read voltage VD3 is corresponding to the variation V4; and the detection read voltage VD4 is corresponding to the variation V5.

Figure 9:
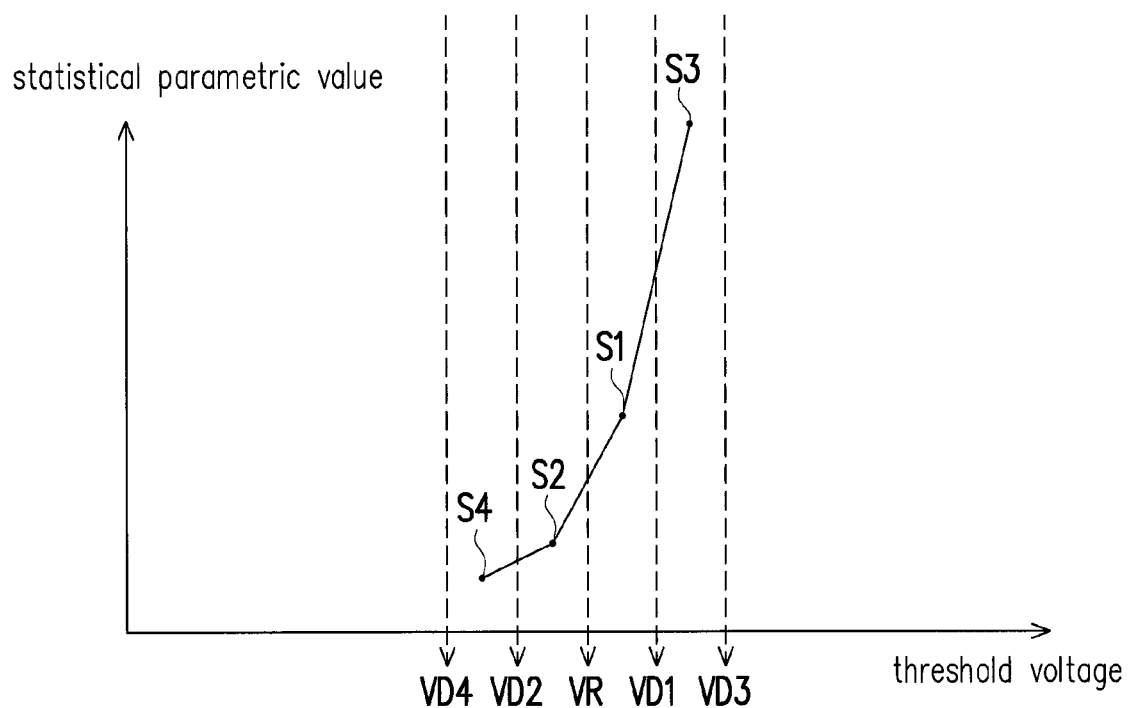
FIG. 9 is a schematic diagram illustrating a relation between the statistical parametric values and the threshold voltages according to an embodiment of the invention.

Accordingly, in step S732, the memory controller 104 may calculate and obtain statistical parametric values between the predetermined read voltage VR and the detection read voltages VD1 to VD4 adjacent to each other according to the voltage ranges of the variations V1 to V5 and the predetermined intervals R1 to R4 respectively corresponding to the predetermined read voltage VR and the detection read voltages VD1 to VD4. More specifically, FIG. 9 is a schematic diagram illustrating a relation between the statistical parametric values and the threshold voltages according to an embodiment of the invention. Referring to FIG. 8 and FIG. 9 together, in the present embodiment, statistical parametric values S1 to S4 between the predetermined read voltage VR and the detection read voltages VD1 to VD4 adjacent to each other are obtained by calculating an area of a region corresponding to two variations in each of the predetermined intervals R1 to R4. For instance, the statistical parametric value S1 between the predetermined read voltage VR and the detection read voltage VD1 is equal to an area of a region a1 (a slash region depicted in FIG. 8) corresponding to the variation V1, the variation V2 and the predetermined interval R1.

With the same method as described above, the memory controller 104 may also obtain the statistical parametric values S2 to S4 by calculating areas of regions. More specifically, the statistical parametric values S1 to S4 may represent the number of memory cells having the threshold voltage that falls within each of the predetermined intervals R1 to R4, respectively. For instance, the statistical parametric value S1 may be referred to as the number of the memory cells having the threshold voltage that falls between predetermined read voltage VR and the detection read voltage VD1. As shown in FIG. 9, the statistical parametric value S1 is provided between the predetermined read voltage VR and the detection read voltage VD1; the statistical parametric value S2 is provided between the predetermined read voltage VR and the detection read voltage VD2; the statistical parametric value S3 is provided between the detection read voltage VD1 and the detection read voltage VD3; and the statistical parametric value S4 is provided between the detection read voltage VD2 and the detection read voltage VD4.

On the other hand, in the present embodiment, the memory controller 104 may determine whether the optimized read voltage can be searched from the statistical parametric values currently recorded by using other mechanisms. In step S740, the memory controller 104 determines whether a local minimum can be searched from the statistical parametric values. In brief, as shown in FIG. 9, in case the current statistical parametric values S1 to S4 are gradually increased along with increases in the threshold voltages, it indicates that the local minimum may not be included in the statistical parametric values currently recorded. Otherwise, it indicates that the local minimum may have included in the statistical parametric values currently recorded, such that the memory controller 104 may obtain the optimized read voltage in subsequent processes according to the local minimum included in the statistical parametric values.

Accordingly, in case the determination in step S740 is yes, proceeding to step S750 in which the memory controller 104 obtains an optimized read voltage according to the statistical parametric values. If the determination in step S740 is no, it indicates that the local minimum is not included in the current statistical parametric values. In order to obtain sufficient amount of information for estimating the optimized read voltage, the memory controller 104 may obtain additional information by using an additional detection read voltage. Prior to this, in step S760, the memory controller 104 determines whether a read number is greater than a predetermined number. Therein, the read number is a sum of a number of times for applying the detection read voltages and the predetermined read voltage to the memory cells and a number of times for applying the additional detection read voltage to the memory cells (i.e., a number of times for the memory controller 104 to read the data).

If the read number is greater than the predetermined number, the memory controller 104 stops reading and applying the additional detection read voltage. Accordingly, proceeding back to step S750 in which the memory controller 104 obtains the optimized read voltage according to the statistical parametric values currently recorded. If the read number is not greater than the predetermined number, in step S770, the memory controller 104 applies an additional detection read voltage to the memory cells, and calculates an additional statistical parametric value between one of the detection read voltages adjacent to the additional detection read voltage and the additional detection read voltage.

Figure 10:
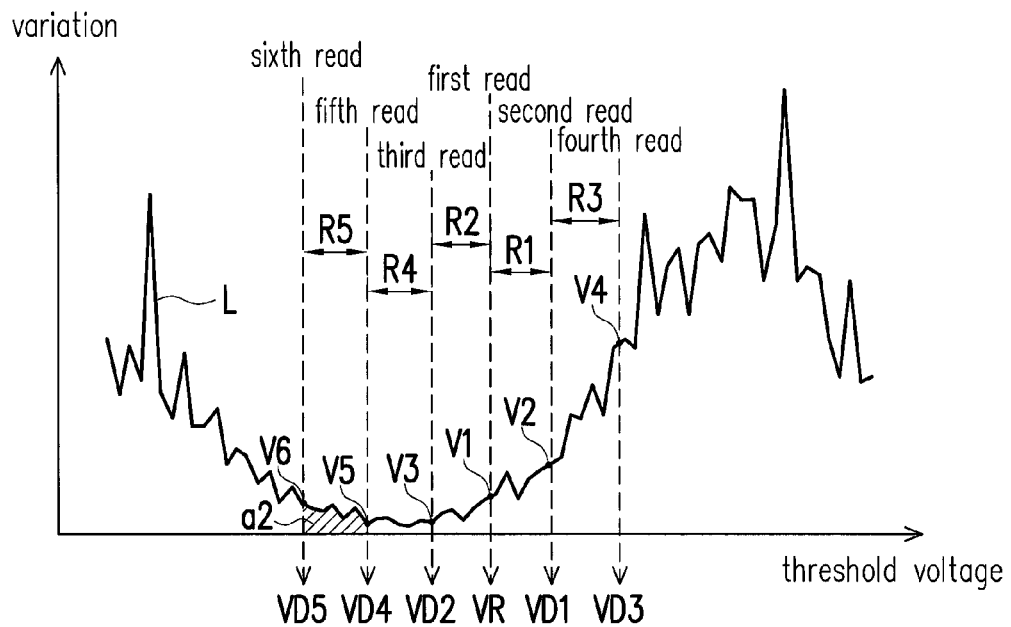
FIG. 10 is a schematic diagram illustrating a relation between the variations and the threshold voltages according to an embodiment of the invention.

Here, FIG. 10 is a schematic diagram illustrating a relation between the variations and the threshold voltages according to an embodiment of the invention. Referring to FIG. 10, the memory controller 104 obtains the detection read voltage VD5 according to the voltage range of the predetermined interval R5, and applies the detection read voltage VD5 to perform a sixth read, so as to obtain a variation V6 corresponding to the detection read voltage VD5. The voltage range of the predetermined interval R5 may be identical to or different from that of the predetermined intervals R1 to R4 depended on the actual applications. After the variation V6 is obtained by the memory controller 104, an area of a region a2 may be obtained by the memory controller 104 according to the voltage ranges of the variation V5, the variation V6 and the predetermined interval R5. In other words, an additional statistical parametric value S5 may be obtained by the memory controller 104 according to the voltage ranges of the variation V5, the variation V6 and the predetermined interval R5.

Figure 11:
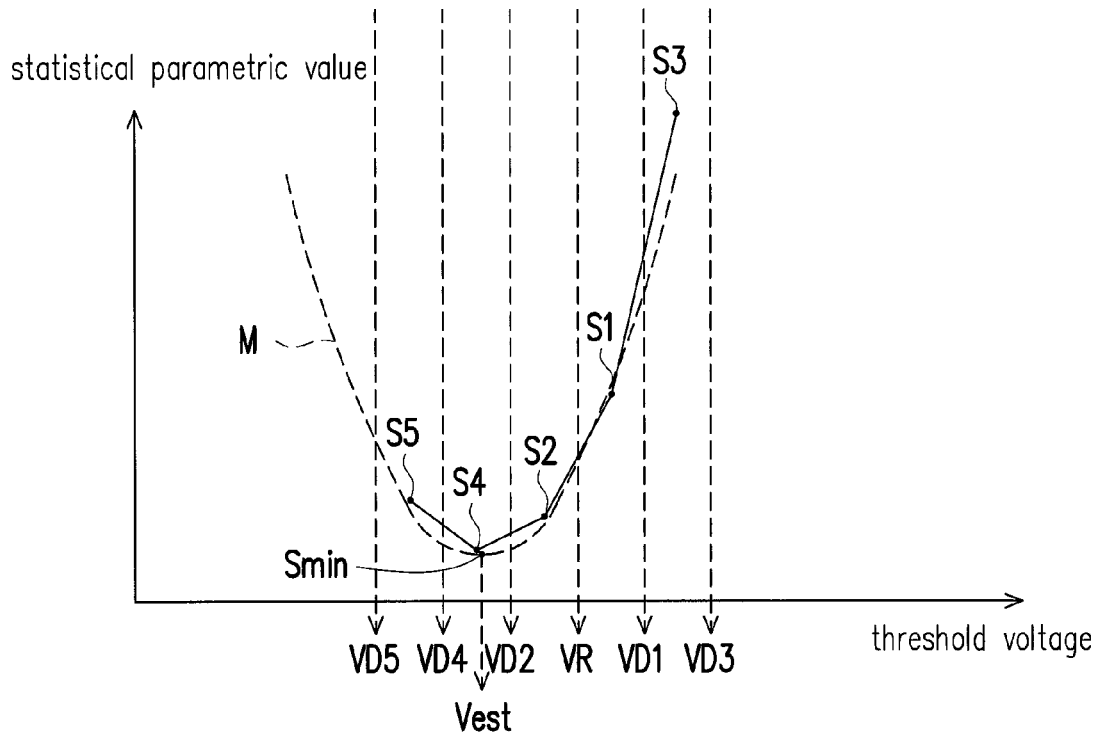
FIG. 11 is a schematic diagram illustrating a relation between the statistical parametric values and the threshold voltages according to an embodiment of the invention.

In step S780, the memory controller 104 records the additional statistical parametric value as one of the statistical parametric values. FIG. 11 is a schematic diagram illustrating a relation between the variations and the threshold voltages according to an embodiment of the invention. Referring to FIG. 11, the memory controller 104 adds the additional statistical parametric value S5 into the statistical parametric values S1 to S4 already being recorded. Apparently, all of the statistical parametric values S1 to S5 are not only simply gradually increased or gradually decreased along with increases in the threshold voltages. This indicates that the local minimum may be searched from the statistical parametric values S1 to S5 by the memory controller 104 without reading again for obtaining the additional statistical parametric value.

Next, after the statistical parametric values S1 to S5 are obtained by the memory controller 104, proceeding to step S750 in which the memory controller 104 obtains the optimized read voltage according to the statistical parametric values currently recorded. In the present embodiment, step S750 includes steps S751 to S753. First, in step S751, the memory controller 104 establishes a polynomial equation according to the statistical parametric values currently recorded and approximates the statistical parametric values through the polynomial equation. For instance, as shown in FIG. 11, the memory controller 104 may establish a quadratic function (as shown in a dash line M in FIG. 11) according to the statistical parametric values currently recorded, but the invention is not limited thereto. Thereafter, in step S752, the memory controller 104 determines whether the polynomial equation and the statistical parametric values are in a normal status according to the polynomial equation and the statistical parametric values.

More specially, in case an inaccurate error value is obtained when one of the statistical parametric values currently recorded is interfered by noises or other factors, the memory controller 104 may obtain the polynomial equation which cannot accurately approximate other statistical parametric values due to said error value. Accordingly, the memory controller 104 may, for example, determine whether the polynomial equation and the statistical parametric values are in the normal status (indicating a real situation) by calculating a root-mean-square error of all the statistical parametric values and the polynomial equation. If the determination in step S752 is no, proceeding to step S770 in which the memory controller 104 applies an additional detection read voltage to the memory cells, and calculates an additional statistical parametric value between one of the detection read voltages adjacent to the additional detection read voltage and the additional detection read voltage.

If the determination in step S752 is yes, proceeding to step S753 in which the memory controller 104 searches a minimum estimated value of the polynomial equation and obtains the optimized read voltage according to the minimum estimated value. For instance, as shown in FIG. 11, a minimum estimated value Smin (a lowest point at the dash line M) of the quadratic function M may be searched by the memory controller 104, and an optimized read voltage Vest may be obtained according to the minimum estimated value Smin. In other words, based on the statistical parametric values S1 to S5 corresponding to each of the predetermined intervals R1 to R5, the memory controller 104 may estimate a statistical amount of the current memory cells having the threshold voltage that falls within each of the predetermined interval R1 to R5, and further estimate the optimized read voltage Vest according to above-said information. Accordingly, the memory controller 104 may lower a bit error rate when reading the data by using the optimized read voltage Vest.

It should be noted that, the memory controller 104 may also use other parameter information for deciding the optimized read voltage. More specifically, in the present embodiment, the memory controller 104 may determine whether the statistical parametric values are in a first shifting status or in a second shifting status according to a parametric model. Accordingly, the additional detection read voltage being greater than or less than the predetermined read voltage may be selected. Therein, the parametric model may be established based on experiments or simulations being performed in advance. For instance, according to a gradient of a connection between statistical parametric values and the parametric model established in advance, the memory controller 104 may be known of whether the optimized read voltage is shifted towards a direction to be greater than the predetermined read voltage or shifted towards a direction to be less than the predetermined read voltage. As shown in FIG. 9, a gradient between the statistical parametric value S1 and the statistical parametric value S2 is positive, and a gradient between the statistical parametric value S3 and the statistical parametric value S2 is also positive. Accordingly, it can be known that the optimized read voltage is shift towards the direction to be less than the predetermined read voltage.

Thus, when the statistical parametric values are in the second shifting status, this indicates that optimized read voltage is shifted towards the direction to be less than the predetermined read voltage, so that the memory controller 104 may select the additional detection read voltage less than the predetermined read voltage. Otherwise, when the statistical parametric values are in the first shifting status, this indicates that optimized read voltage is shifted towards the direction to be greater than the predetermined read voltage, so that the memory controller 104 may select the additional detection read voltage greater than the predetermined read voltage.

In summary, the solid state storage device and the sensing voltage setting method thereof according to the invention are capable of dynamically adjust the read voltages appropriately, so as to avoid loss of the data. Moreover, the optimized read voltage may be obtained by applying a small amount of the detection voltages in the invention, so that the optimized read voltage may be implemented in actual applications more easily. In the invention, the optimized read voltage may be obtained simply by using 4 to 5 of the detection voltages. As a result, the solid state storage device may identify the stored data by using the optimized read voltage, so as to lower the bit error rate when reading the data.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A sensing voltage setting method of a solid state storage device, wherein the solid state storage device comprises a flash memory module configured for storing data, the flash memory module has a plurality of memory cells, each of the memory cells has a first storage state and a second storage state, and the sensing voltage setting method comprises:
   adjusting a predetermined read voltage of the memory cells to obtain a plurality of detection read voltages;
   applying the predetermined read voltage and the detection read voltages respectively to the memory cells to read a plurality of verification bit data corresponding to the predetermined read voltage and the detection read voltages;
   calculating and recording a plurality of statistical parametric values between the predetermined read voltage and the detection read voltages adjacent to each other according to the verification bit data corresponding to the predetermined read voltage and the detection read voltages; and
   obtaining an optimized read voltage according to the statistical parametric values.

2. The sensing voltage setting method of claim 1, wherein adjusting the predetermined read voltage of the memory cells to obtain the detection read voltages comprises:
   using the predetermined read voltage as a reference for obtaining the detection read voltages according to the predetermined read voltage and a plurality of predetermined intervals, wherein a number of the detection read voltages is equal to a number of the predetermined intervals.

3. The sensing voltage setting method of claim 2, wherein calculating and recording the statistical parametric values between the predetermined read voltage and the detection read voltages adjacent to each other according to the verification bit data corresponding to the predetermined read voltage and the detection read voltages comprises:
calculating a plurality of variations of bit data identified as in the first storage state among the verification bit data corresponding to the predetermined read voltage and the detection read voltages; and
calculating and obtaining the statistical parametric values between the predetermined read voltage and the detection read voltages adjacent to each other according to the variations and the predetermined intervals respectively corresponding to the predetermined read voltage and the detection read voltages.

4. The sensing voltage setting method of claim 1, wherein before obtaining the optimized read voltage according to the statistical parametric values, the method further comprises:
applying an additional detection read voltage to the memory cells, and calculating an additional statistical parametric value between one of the detection read voltages adjacent to the additional detection read voltage and the additional detection read voltage; and
recording the additional statistical parametric value as one of the statistical parametric values.

5. The sensing voltage setting method of claim 4, wherein after establishing the polynomial equation according to the statistical parametric values currently recorded and approximating the statistical parametric values through the polynomial equation, the method further comprises:
determining whether the polynomial equation and the statistical parametric values are in a normal status according to the polynomial equation and the statistical parametric values; and
if the polynomial equation and the statistical parametric values are not in the normal status, applying the additional detection read voltage to the memory cells to obtain the additional statistical parametric value and record the additional statistical parametric value as one of the statistical parametric values.

6. The sensing voltage setting method of claim 4, further comprising:
determining whether the statistical parametric values are in a first shifting status or in a second shifting status according to a parametric model;
when the statistical parametric values are in the first shifting status, selecting the additional detection read voltage greater than the predetermined read voltage; and
when the statistical parametric values are in the second shifting status, selecting the additional detection read voltage less than the predetermined read voltage.

7. The sensing voltage setting method of claim 1, wherein obtaining the optimized read voltage according to the statistical parametric values comprises:
establishing a polynomial equation according to the statistical parametric values currently recorded and approximating the statistical parametric values through the polynomial equation; and
searching a minimum estimated value according to the polynomial equation and obtaining the optimized read voltage according to the minimum estimated value.

8. The sensing voltage setting method of claim 7, wherein before establishing the polynomial equation according to the statistical parametric values currently recorded and approximating the statistical parametric values through the polynomial equation, the method further comprises:
determining whether a local minimum can be searched from the statistical parametric values; and
if the local minimum cannot be searched from the statistical parametric values, applying an additional detection read voltage to the memory cells to obtain the additional statistical parametric value and record the additional statistical parametric value as one of the statistical parametric values.

9. The sensing voltage setting method of claim 6, wherein before applying the additional detection read voltage to the memory cells to obtain the additional statistical parametric value and record the additional statistical parametric value as one of the statistical parametric values, the method further comprises:
determining whether a read number is greater than a predetermined number, wherein the read number is a sum of a number of times for applying the detection read voltages and applying the predetermined read voltage to the memory cells and a number of times for applying the additional detection read voltage to the memory cells; and
if the read number is greater than the predetermined number, obtaining the optimized read voltage according to the statistical parametric values currently recorded.

10. A solid state storage device, comprising:
a flash memory module having a plurality of memory cells, and each of the memory cells having a first storage state and a second storage state; and
a memory controller coupled to the flash memory module, and the memory controller being configured to adjust a predetermined read voltage of the memory cells to obtain a plurality of detection read voltages,
wherein the memory controller is further configured to apply the predetermined read voltage and the detection read voltages respectively to the memory cells to read a plurality of verification bit data corresponding to the predetermined read voltage and the detection read voltages,
wherein the memory controller is further configured to calculate and record a plurality of statistical parametric values between the predetermined read voltage and the detection read voltages adjacent to each other according to the verification bit data corresponding to the predetermined read voltage and the detection read voltages,
wherein the memory controller is further configured to obtain an optimized read voltage according to the statistical parametric values.

11. The solid state storage device of claim 10, wherein the solid state storage device uses the predetermined read voltage as a reference for obtain the detection read voltages according to the predetermined read voltage and a plurality of predetermined intervals, wherein a number of the detection read voltages is equal to a number of the predetermined intervals.

12. The solid state storage device of claim 10, wherein the memory controller is further configured to calculate a plurality of variations of bit data identified as in the first storage state among the verification bit data corresponding to the predetermined read voltage and the detection read voltages; and the memory controller is further configured to calculate and obtain the statistical parametric values between the predetermined read voltage and the detection read voltages adjacent to each other according to the variations and the predetermined intervals respectively corresponding to the predetermined read voltage and the detection read voltages.

13. The solid state storage device of claim 10, wherein the memory controller is further configured to apply an additional detection read voltage to the memory cells, calculate an additional statistical parametric value between one of the detection read voltages adjacent to the additional detection read voltage and the additional detection read voltage, and record the additional statistical parametric value as one of the statistical parametric values.

14. The solid state storage device of claim 13, wherein the memory controller is further configured to determine whether the statistical parametric values are in a first shifting status or in a second shifting status according to a parametric model,
wherein when the statistical parametric values are in the first shifting status, the memory controller is further configured to select the additional detection read voltage greater than the predetermined read voltage; and when the statistical parametric values are in the second shifting status, the memory controller is further configured to select the additional detection read voltage less than the predetermined read voltage.

15. The solid state storage device of claim 10, wherein the memory controller is further configured to establish a polynomial equation according to the statistical parametric values currently recorded and approximate the statistical parametric values through the polynomial equation; and search a minimum estimated value according to polynomial equation and obtain the optimized read voltage according to the minimum estimated value.

16. The solid state storage device of claim 15, wherein the memory controller is further configured to determine whether a local minimum can be searched from the statistical parametric values; and if the local minimum cannot be searched from the statistical parametric values, the memory controller is further configured to apply an additional detection read voltage to the memory cells to obtain the additional statistical parametric value and record the additional statistical parametric value as one of the statistical parametric values.

17. The solid state storage device of claim 16, wherein the memory controller is further configured to determine whether a read number is greater than a predetermined number, wherein the read number is a sum of a number of times for applying the detection read voltages and applying the predetermined read voltage to the memory cells and a number of times for applying the additional detection read voltage to the memory cells,
wherein if the read number is greater than the predetermined number, the memory controller is further configured to obtain the optimized read voltage according to the statistical parametric values currently recorded.

18. The solid state storage device of claim 15, wherein the memory controller is further configured to determine whether the polynomial equation and the statistical parametric values are in a normal status according to the polynomial equation and the statistical parametric values,
wherein if the polynomial equation and the statistical parametric values are not in the normal status, the memory controller is further configured to apply the additional detection read voltage to the memory cells to obtain the additional statistical parametric value and record the additional statistical parametric value as one of the statistical parametric values.

* * * * *